US012575445B2

(12) United States Patent
Kurachi et al.

(10) Patent No.: US 12,575,445 B2
(45) Date of Patent: Mar. 10, 2026

(54) SEMICONDUCTOR APPARATUS AND METHOD FOR MANUFACTURING SEMICONDUCTOR APPARATUS

(71) Applicant: Mitsubishi Electric Corporation, Tokyo (JP)

(72) Inventors: Masaki Kurachi, Tokyo (JP); Tatsuya Kawase, Tokyo (JP); Kentaro Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 600 days.

(21) Appl. No.: 17/996,888

(22) PCT Filed: Oct. 23, 2020

(86) PCT No.: PCT/JP2020/039959
§ 371 (c)(1),
(2) Date: Oct. 21, 2022

(87) PCT Pub. No.: WO2022/085192
PCT Pub. Date: Apr. 28, 2022

(65) Prior Publication Data
US 2023/0154808 A1     May 18, 2023

(51) Int. Cl.
*H01L 23/043*          (2006.01)
*H01L 21/48*           (2006.01)
(Continued)

(52) U.S. Cl.
CPC ........ *H01L 23/043* (2013.01); *H01L 21/4807* (2013.01); *H01L 21/4817* (2013.01);
(Continued)

(58) Field of Classification Search
CPC ............... H01L 23/043; H01L 21/4807; H01L 21/4817; H01L 23/3735; H01L 24/32;
(Continued)

(56) References Cited

U.S. PATENT DOCUMENTS

| 2004/0102023 A1* | 5/2004 | Morozumi | .......... H01L 23/3735 |
| | | | 438/460 |
| 2006/0157862 A1 | 7/2006 | Nishimura et al. | |
| 2017/0278770 A1 | 9/2017 | Kato et al. | |
| 2017/0367213 A1* | 12/2017 | Yokoyama | .......... H01L 23/3735 |

FOREIGN PATENT DOCUMENTS

| CN | 107431053 A | 12/2017 |
| DE | 10 2006 002 452 A1 | 7/2006 |

(Continued)

OTHER PUBLICATIONS

An Office Action; mailed by the China National Intellectual Property Administration of the People's Republic of China on Feb. 12, 2025, which corresponds to Chinese Patent Application No. 202080106361.8 and is related to U.S. Appl. No. 17/996,888.

(Continued)

*Primary Examiner* — Patricia D Valenzuela
(74) *Attorney, Agent, or Firm* — Studebaker Brackett PLLC

(57)          ABSTRACT

A semiconductor apparatus includes: a base plate; an insulating circuit board including a ceramic substrate, a circuit pattern formed on an upper surface of the ceramic substrate, a metal layer formed on a lower surface of the ceramic substrate and fixed on an upper surface of the base plate with a first joint material; a semiconductor device having a first surface fixed on the circuit pattern with a second joint material and a second surface which is an opposite surface of the first surface; a lead frame fixed on the second surface with a third joint material; and a case fixed to an outer edge portion of the base plate and enclosing the semiconductor device, wherein restoring force acts on the insulating circuit board in a direction of warpage that is convex upward, and restoring force acts on the base plate in a direction of warpage that is convex downward.

15 Claims, 4 Drawing Sheets

(51) Int. Cl.
*H01L 23/00* (2006.01)
*H01L 23/373* (2006.01)

(52) U.S. Cl.
CPC .......... *H01L 23/3735* (2013.01); *H01L 24/32*
(2013.01); *H01L 24/40* (2013.01); *H01L 24/73*
(2013.01); *H01L 2224/32225* (2013.01); *H01L*
*2224/40139* (2013.01); *H01L 2224/73263*
(2013.01); *H01L 2924/3511* (2013.01); *H01L*
*2924/3512* (2013.01)

(58) Field of Classification Search
CPC ..................... H01L 24/40; H01L 24/73; H01L
2224/32225; H01L 2224/40139; H01L
2224/73263; H01L 2924/3511; H01L
2924/3512; H01L 23/053; H01L 23/36;
H01L 24/34; H01L 23/24; H01L 24/29;
H01L 23/15
See application file for complete search history.

(56) References Cited

FOREIGN PATENT DOCUMENTS

| DE | 11 2014 007 285 T5 | 10/2017 |
|----|--------------------|---------|
| JP | 2008-085360 A | 4/2008 |
| JP | 2010-010505 A | 1/2010 |
| JP | 2015-170785 A | 9/2015 |
| JP | 2019-207897 A | 12/2019 |

OTHER PUBLICATIONS

International Search Report issued in PCT/JP2020/039959; mailed Dec. 28, 2020.
An Office Action issued by the State Intellectual Property Office of the People's Republic of China on Sep. 18, 2024, which corresponds to Chinese Patent Application No. CN 202080106361.8.
Office Action issued in DE 11 2020 007 724.1; mailed by the German Patent and Trademark Office on Aug. 18, 2025.

* cited by examiner

SEMICONDUCTOR APPARATUS AND METHOD FOR MANUFACTURING SEMICONDUCTOR APPARATUS

FIELD

The present disclosure relates to a semiconductor apparatus and a method for manufacturing the semiconductor apparatus.

BACKGROUND

In a semiconductor apparatus in related art, for example, a thickness of a semiconductor device is set equal to or less than 100 µm, a sum of thicknesses of conductive layers to be wired on front and rear surfaces of a ceramic substrate is set equal to or greater than 0.7 mm and equal to or less than 2.0 mm, and a thickness of the ceramic substrate is set equal to or greater than 0.1 mm and equal to or less than 1.0 mm.

CITATION LIST

Patent Literature

[PTL 1] JP 2010-10505 A

SUMMARY

Technical Problem

If a semiconductor apparatus is warped when the semiconductor apparatus is assembled, the semiconductor apparatus cannot be stably assembled. Particularly, in a case of a semiconductor apparatus including a lead frame to be bonded to a semiconductor device through solder joint, there is a problem that the lead frame cannot be appropriately bonded through solder joint due to warpage. For example, trying to assemble the semiconductor apparatus using a flat metal base plate which is not warped involves a problem that the base plate and a structure over the base plate are warped in an upward convex direction in the process of assembly, which makes the assembly difficult.

The present disclosure has been made to solve the above-described problems and is directed to providing a semiconductor apparatus capable of improving a yield ratio and a method for manufacturing the semiconductor apparatus.

Solution to Problem

A semiconductor apparatus according to the present disclosure includes: a base plate; an insulating circuit board including a ceramic substrate, a circuit pattern formed on an upper surface of the ceramic substrate, and a metal layer formed on a lower surface of the ceramic substrate and fixed on an upper surface of the base plate with a first joint material; a semiconductor device having a first surface fixed on the circuit pattern with a second joint material and a second surface which is an opposite surface of the first surface; a lead frame fixed on the second surface with a third joint material; and a case fixed to an outer edge portion of the base plate and enclosing the semiconductor device, wherein restoring force acts on the insulating circuit board in a direction of warpage that is convex upward, and restoring force acts on the base plate in a direction of warpage that is convex downward.

A method for manufacturing the semiconductor apparatus according to the present disclosure includes: fixing an outer edge portion of a base plate to a case, the base plate having warpage in a downward convex shape; placing an insulating circuit board on the base plate via a first joint material, the insulating circuit board including a ceramic substrate, a circuit pattern formed on an upper surface of the ceramic substrate, and a metal layer formed on a lower surface of the ceramic substrate; placing a semiconductor device on the circuit pattern via a second joint material; placing a lead frame on the semiconductor device via a third joint material; melting the first joint material, the second joint material and the third joint material, wherein force that is generated by the melting and warps the insulating circuit board in an upward convex shape is alleviated by warpage of the base plate so that warpage of the insulating circuit board is reduced.

Other features of the present disclosure will be described below.

Advantageous Effects of Invention

In the present disclosure, the yield can be increased by canceling out the restoring forces of the insulated circuit board and the base plate.

DESCRIPTION OF EMBODIMENTS

A semiconductor apparatus and a method for manufacturing the semiconductor apparatus according to the embodiments of the present disclosure will be described with reference to the drawings. The same components will be denoted by the same symbols, and the repeated description thereof may be omitted.

First Embodiment

Figure 1:
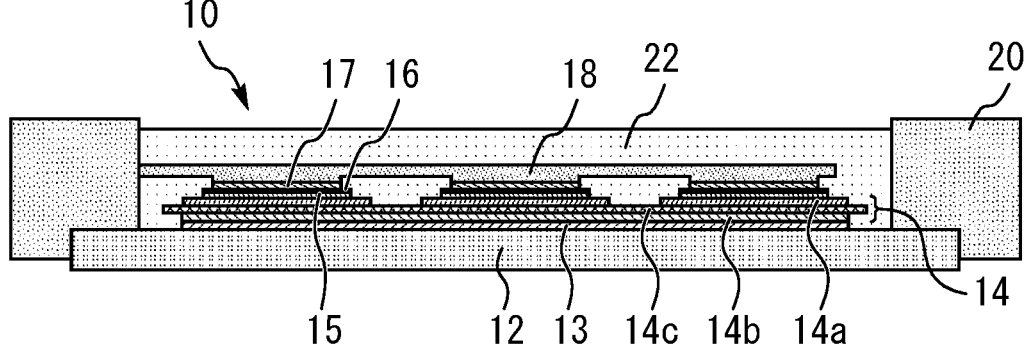
FIG. 1 is a cross-section view of a semiconductor apparatus according to a first embodiment.

FIG. 1 is a cross-section view of a semiconductor apparatus 10 according to a first embodiment. The semiconductor apparatus 10 includes a base plate 12. The base plate 12 is formed with, for example, a metal such as Al and Cu. According to one example, a thickness of the base plate 12 is equal to or greater than 3 mm.

In a central portion on a surface of the base plate 12, an insulating circuit board 14 is fixed with a first joint material 13. According to one example, the first joint material 13 is a solder such as a paste solder or a plate solder. The joint material, which is melted by heating and used to bond members, is a solder as one example.

The insulating circuit board 14 includes a ceramic substrate 14c, a circuit pattern 14a formed on an upper surface of the ceramic substrate 14c, and a metal layer 14b formed on a lower surface of the ceramic substrate 14c. A material of the ceramic substrate 14c is, for example, $Al_2O_3$, AlN or $Si_3N_4$. According to one example, a thickness of the ceramic substrate 14c is equal to or greater than 0.2 mm and less than 0.4 mm. According to another example, the thickness of the ceramic substrate 14c can be set equal to or greater than 0.3 mm and equal to or less than 0.35 mm. A material of the circuit pattern 14a and the metal layer 14b is, for example, Al or Cu. According to one example, each thickness of the circuit pattern 14a and the metal layer 14b can be set equal to or greater than 0.6 mm and less than 1.0 mm. The thickness of the circuit pattern 14a may be made the same as or different from the thickness of the metal layer 14b.

The metal layer 14b which is a component of the insulating circuit board 14 is fixed on an upper surface of the base plate 12 with the first joint material 13. On the other hand, a semiconductor device 16 is fixed on the circuit pattern 14a with a second joint material 15. The semiconductor device 16 has a first surface which is a lower surface and a second surface which is an opposite surface of the first surface, and the first surface is fixed on the circuit pattern 14a with the second joint material 15. The semiconductor device 16 is formed with, for example, Si, SiC or GaN.

A lead frame 18 is fixed on the second surface of the semiconductor device 16 with a third joint material 17. A material of the lead frame 18 is, for example, Cu. As illustrated in FIG. 1, the lead frame 18 can be bonded to a plurality of semiconductor devices 16. In the example in FIG. 1, the lead frame 18 has a length equal to a width of the insulating circuit board 14 to fix the lead frame 18 to three semiconductor devices 16. According to another example, one lead frame can be fixed to a plurality of semiconductor devices with the third joint material.

The lead frame 18 is supported by a case 20 by being partially embedded into the case 20 or being partially attached to the case 20. The case 20 is fixed to an outer edge portion of the base plate 12 and encloses the plurality of semiconductor devices 16. A material of the case 20 is, for example, PPS. Inside of the case 20 is filled with a seal material 22. The seal material 22 is, for example, silicone gel.

The example in FIG. 1 illustrates that warpage of the whole semiconductor apparatus 10 is reduced. The warpage is reduced by restoring force in a direction of warpage that is convex upward on the insulating circuit board 14 cancelling out restoring force in a direction of warpage that is convex downward on the base plate 12. In other words, the insulating circuit board 14 has an upward convex shape if no other force is applied, and the base plate 12 has a downward convex shape if no other force is applied. However, as a result of the insulating circuit board 14 being bonded to the base plate 12 with the first joint material 13, warpage of both is cancelled out. The insulating circuit board 14 has the restoring force in the upward convex direction mainly because the semiconductor apparatus is assembled through heating. Specifically, the insulating circuit board 14 is likely to be warped in the upward convex direction, for example, through heating which melts the first joint material 13, the second joint material 15 and the third joint material 17. On the other hand, the base plate 12 has the restoring force in the downward convex direction because the base plate 12 is subjected to initial warpage in the same direction.

In this manner, the assembled semiconductor apparatus 10 is less warped in the whole apparatus. This enables the lead frame 18 to be stably bonded to the semiconductor device 16. Specifically, variation in a thickness of the third joint material 17 between the lead frame 18 and the semiconductor device 16 is reduced, so that it is possible to improve power cycle (P/C) reliability.

Further, according to one example, as a result of the restoring force being cancelled out, the semiconductor device 16 and the lead frame 18 are assembled in a state where a structure including the base plate 12 and the insulating circuit board 14 is substantially flat, which makes the assembly easier.

Still further, according to one example, by making the ceramic substrate 14c relatively thinner, that is, equal to or greater than 0.2 mm and less than 0.4 mm or equal to or greater than 0.3 mm and equal to or less than 0.35 mm and making the circuit pattern 14a and the metal layer 14b thicker, that is, equal to or greater than 0.6 mm and less than 1.0 mm, a linear coefficient of expansion of the insulating circuit board 14 can be made closer to linear coefficients of expansion of the circuit pattern 14a and the metal layer 14b. By this means, an apparent linear coefficient of expansion of the insulating circuit board 14 becomes closer to the linear coefficient of expansion of the base plate 12, and thermal stress to be applied to the first joint material 13 which is a bonding layer is alleviated. This can reduce cracks to be generated in the first joint material 13 during a temperature cycle test.

According to another example, by making the thickness of the circuit pattern 14a equal to or greater than 1.5 times and also making the thickness of the metal layer 14b equal to or greater than 1.5 times with respect to the thickness of the ceramic substrate 14c, the apparent linear coefficient of expansion of the insulating circuit board 14 becomes closer to the linear coefficients of expansion of the circuit pattern 14a and the metal layer 14b.

In either example, by using the same material as materials of the circuit pattern 14a, the metal layer 14b and the base plate 12, a gap between the linear coefficient of expansion of the insulating circuit board 14 and the linear coefficient of expansion of the base plate 12 can be made smaller. This can improve an effect of alleviating thermal stress to be applied to the first joint material 13 and reducing cracks to be generated during a temperature cycle test.

Figure 2:
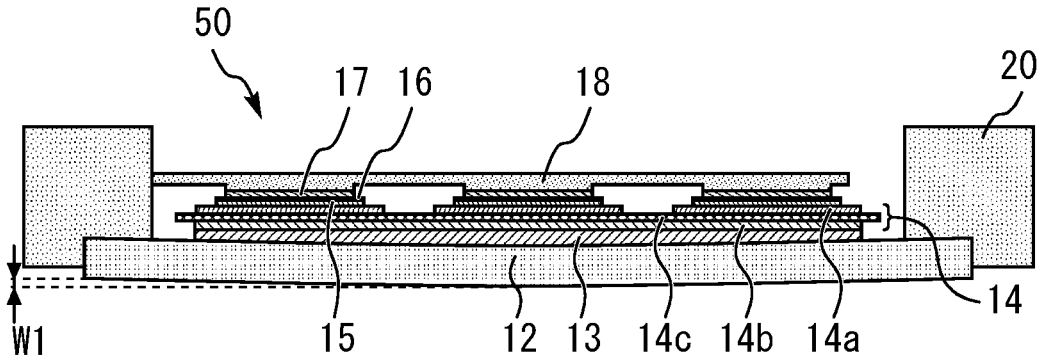
FIG. 2 is a cross-section view illustrating an example of the semiconductor apparatus before assembly.

A method for manufacturing the semiconductor apparatus described above will be described. FIG. 2 is a cross-section view illustrating an example of the semiconductor apparatus before assembly. The base plate 12 is subjected to initial warpage. The base plate 12, before the semiconductor apparatus is assembled, has warpage in a downward convex shape. FIG. 2 illustrates that a difference in height W1 occurs on the lower surface of the base plate 12 as a result of the base plate 12 being along in the downward convex direction. According to one example, as a result of warpage in the downward convex shape, a bottom surface of an outer edge of the base plate 12 is higher than a bottom surface of the center of the base plate 12 by less than 1.0 mm. Such a state is referred to as a warpage amount of less than 1.0 mm. According to another example, this warpage amount can be made less than 0.6 mm.

First, a configuration illustrated in FIG. 2 is completed. According to one example, a process for completing the configuration in FIG. 2 includes the following processes.

(1) Fix an outer edge portion of the base plate 12 to the case 20.

(2) Place the insulating circuit board 14 on the base plate 12 via the first joint material 13.

(3) Place the semiconductor device 16 on the circuit pattern 14a via the second joint material 15.

(4) Place the lead frame 18 on the semiconductor device 16 via the third joint material 17.

Next, the first joint material 13, the second joint material 15 and the third joint material 17 are melted, the insulating circuit board 14 is fixed to the base plate 12, the semiconductor device 16 is fixed to the insulating circuit board 14, and the lead frame 18 is fixed to the semiconductor device 16. The fixing can be performed at the same time. According to another example, after the insulating circuit board 14 is fixed to the base plate 12, and the semiconductor device 16 is fixed to the insulating circuit board 14, the lead frame 18 is fixed to the semiconductor device 16. Still further, according to another example, after the insulating circuit board 14 is fixed to the base plate 12, the semiconductor device 16 is fixed to the insulating circuit board 14, and then, the lead frame 18 is fixed to the semiconductor device 16.

By heating for melting the joint materials, force that warps the insulating circuit board 14 in an upward convex shape occurs. The force that warps the insulating circuit board 14 in the upward convex shape is alleviated by warpage of the base plate 12. As a result, warpage of the insulating circuit board 14 is reduced, so that the insulating circuit board 14 becomes flat or has a shape close to a flat shape. Further, warpage of the base plate 12 is also alleviated, so that the base plate 12 becomes flat or has a shape close to a flat shape. The semiconductor apparatus 10 in FIG. 1 is completed in this manner.

In this manner, by the base plate 12 being subjected to initial warpage in advance, warpage of an apparatus occurring through a manufacturing process and the initial warpage of the base plate 12 are cancelled out, so that warpage when assembly is completed can be reduced. By reducing warpage of a configuration including the insulating circuit board 14 and the base plate 12, it is possible to stably assemble the semiconductor apparatus and improve P/C reliability by reducing variation in a thickness of the third joint material 17.

Modifications, corrections or alternatives described in the first embodiment can be applied to a semiconductor apparatus and a method for manufacturing the semiconductor apparatus according to the following embodiments. Concerning the semiconductor apparatus and the method for manufacturing the semiconductor apparatus according to the following embodiments, differences from the first embodiment will be mainly described.

Second Embodiment

Figure 3:
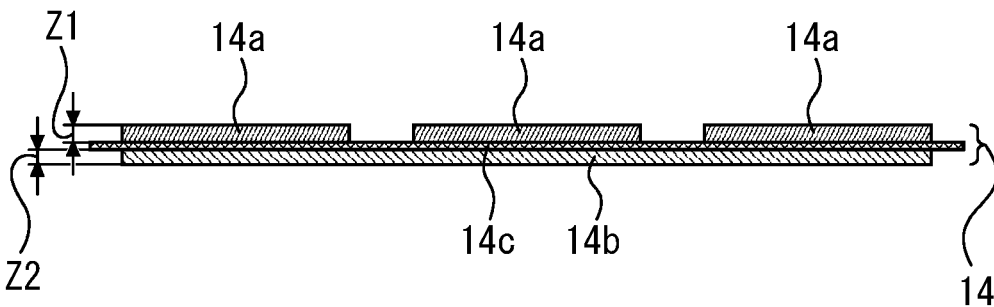
FIG. 3 is a cross-section view of the insulating circuit board according to a second embodiment.

FIG. 3 is a cross-section view of the insulating circuit board 14 according to a second embodiment. The circuit pattern 14a is thicker than the metal layer 14c. FIG. 3 illustrates that a thickness Z1 of the circuit pattern 14a is greater than a thickness Z2 of the metal layer 14c. According to one example, the thickness of the circuit pattern 14a is equal to or greater than 0.6 mm and less than 1.0 mm. By making the circuit pattern 14a thicker than the metal layer 14c, warpage of the insulating circuit board 14 at a high temperature is reduced. It is therefore possible to further reduce variation in the thickness of the third joint material 17 and improve P/C reliability.

The insulating circuit board 14 according to the second embodiment is less likely to be warped, so that initial warpage of the base plate 12 can be made smaller. Further, both the restoring force in the upward convex direction of the insulating circuit board 14 and the restoring force in the downward convex direction of the base plate 12 can be made smaller values.

Figure 4:
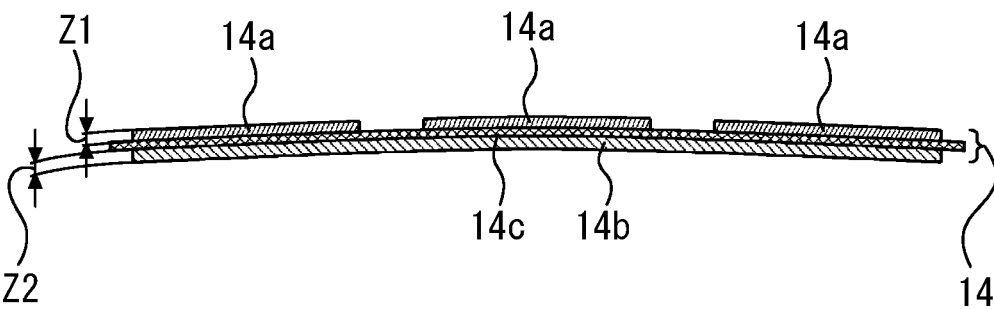
FIG. 4 is a cross-section view of the insulating circuit board according to a comparative example.

FIG. 4 is a cross-section view of the insulating circuit board 14 according to a comparative example. In FIG. 4, the thickness of the circuit pattern 14a is made the same as the thickness of the metal layer 14c. In other words, the thickness Z1 is the same as the thickness Z2. In this case, relatively great warpage occurs in the insulating circuit board 14.

Third Embodiment

Figure 5:
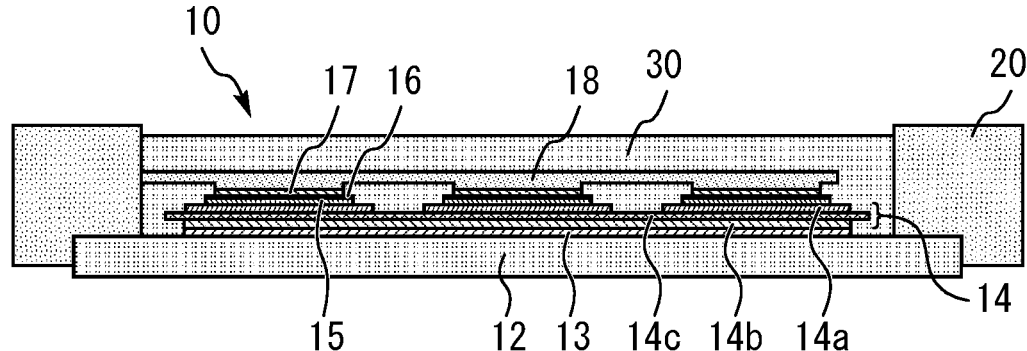
FIG. 5 is a cross-section view of a semiconductor apparatus according to a third embodiment.

FIG. 5 is a cross-section view of a semiconductor apparatus according to a third embodiment. Inside of the case 20 is filled with a resin 30. According to one example, the resin 30 covers all components enclosed by the case 20. The resin 30 has higher elasticity and higher viscosity than gel, and thus, by employing the resin 30, thermal stress to be applied to the first joint material 13 is alleviated. Further, even if variation occurs in thicknesses of the third joint material 17 and the first joint material 13, stable reliability can be obtained by bondage by the resin 30. Still further, bondage by the resin 30 can improve an effect of reducing cracks of the first joint material 13 compared to the first embodiment, so that it is possible to shorten a distance from the semiconductor device 16 to an end portion of the circuit pattern 14a. By shortening the distance, a size of the semiconductor apparatus can be made smaller.

Fourth Embodiment

Figure 6:
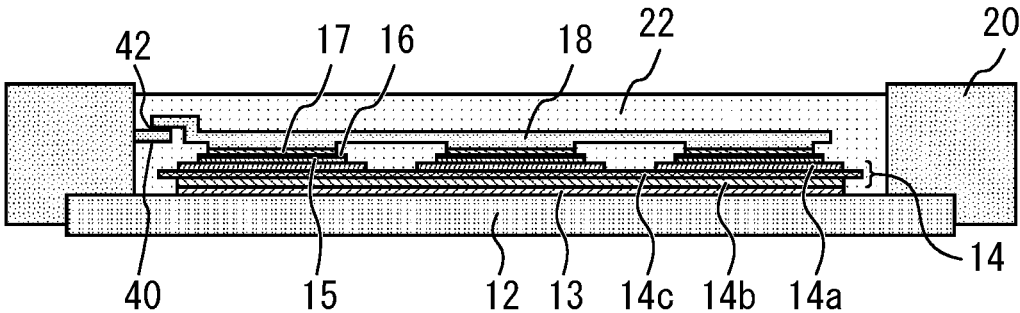
FIG. 6 is a cross-section view of a semiconductor apparatus according to a fourth embodiment.

FIG. 6 is a cross-section view of a semiconductor apparatus according to a fourth embodiment. The semiconductor apparatus includes a terminal 40. Part of the terminal 40 is fixed to the case 20, and the other part is located inside the case 20. The terminal 40 is fixed to the lead frame 18 with a fourth joint material 42 in a region enclosed by the case 20. In the example in FIG. 6, an upper surface of the terminal 40 is fixed to a lower surface of the lead frame 18 with the fourth joint material 42.

If the lead frame 18 is fixed to the case 20, a position of the lead frame 18 is determined, and the position of the lead frame cannot be vertically changed. However, as illustrated in FIG. 6, in a case where the lead frame 18 is fixed to the terminal 40 without the lead frame 18 and the case 20 being integrated, the position of the lead frame 18 can be changed in a vertical direction. For example, by changing a thickness of the fourth joint material 42 and changing a shape of the lead frame 18, the position of the lead frame 18 immediately above the semiconductor device 16 can be easily changed.

By making it possible to change the position of the lead frame 18 in this manner, in a case where a position of the semiconductor device 16 varies due to warpage of the semiconductor apparatus, the lead frame 18 can be provided at a position following the variation. It is therefore possible to reliably and easily perform work of fixing the lead frame 18 to the semiconductor device 16.

Fifth Embodiment

Figure 7:
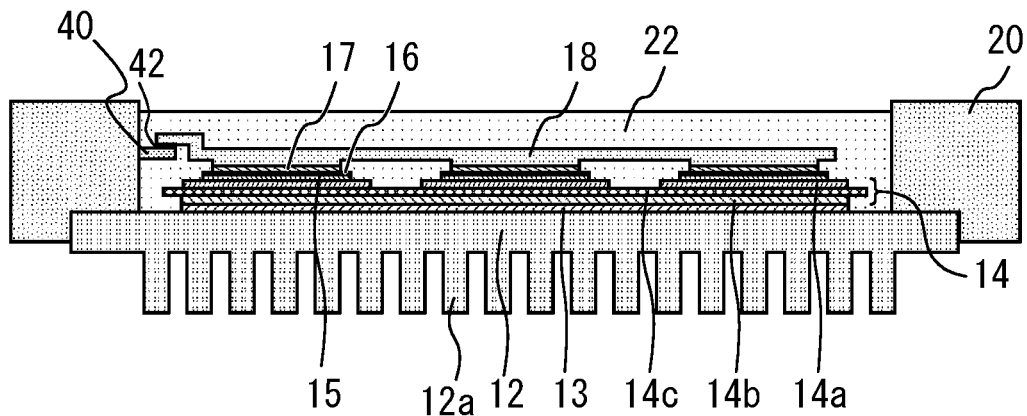
FIG. 7 is a cross-section view of a semiconductor apparatus according to a fifth embodiment.

FIG. 7 is a cross-section view of a semiconductor apparatus according to a fifth embodiment. The base plate 12 includes a pin fin 12a on a rear surface of the base plate 12. In the semiconductor apparatus in FIG. 7, the base plate 12 including the pin fin 12a which is a cooling apparatus is provided on a rear surface of the semiconductor apparatus without thermal grease, or the like, being interposed. Such a structure is referred to as a directly cooling structure. In the directly cooling structure, temperature distribution of a longitudinal structure prominently appears during a power cycle test. If the temperature distribution of the longitudinal structure is great, stress occurring in the first joint material 13 becomes greater. It is therefore extremely important to reduce cracks of the first joint material 13.

As described in the first embodiment, reduction of warpage of the semiconductor apparatus by cancelling out the restoring force contributes to reduction in cracks of the first joint material 13. Thus, thermal performance of the semiconductor apparatus in which the pin fin is provided is improved, so that it is possible to improve reliability and make the apparatus smaller.

Note that characteristics of the semiconductor apparatuses according to the respective embodiments described above may be combined to enhance effects.

REFERENCE SIGNS LIST

10 semiconductor apparatus; 12 base plate; 13 first joint material; 14 insulating circuit board; 14*a* circuit pattern; 14*b* metal layer; 14*c* ceramic substrate; 15 second joint material; 16 semiconductor device; 17 third joint material; 18 lead frame; 20 case

The invention claimed is:

1. A semiconductor apparatus comprising:
a base plate;
an insulating circuit board including a ceramic substrate, a circuit pattern formed on an upper surface of the ceramic substrate, and a metal layer formed on a lower surface of the ceramic substrate and fixed on an upper surface of the base plate with a first joint material;
a semiconductor device having a first surface fixed on the circuit pattern with a second joint material and a second surface which is an opposite surface of the first surface;
a lead frame fixed on the second surface with a third joint material; and
a case fixed to an outer edge portion of the base plate and enclosing the semiconductor device,
wherein restoring force acts on the insulating circuit board in a direction of warpage that is convex upward,
restoring force acts on the base plate in a direction of warpage that is convex downward, and
the ceramic substrate is thinner than each of the circuit pattern and the metal layer.

2. The semiconductor apparatus according to claim 1, wherein the semiconductor device includes a plurality of devices, and the lead frame is fixed to the plurality of devices with the third joint material.

3. The semiconductor apparatus according to claim 1, wherein the circuit pattern is thicker than the metal layer.

4. The semiconductor apparatus according to claim 1, comprising a resin filled inside the case.

5. The semiconductor apparatus according to claim 1, comprising a terminal fixed to the case and fixed to the lead frame with a fourth joint material in a region enclosed by the case.

6. The semiconductor apparatus according to claim 1, wherein the base plate includes a pin fin.

7. The semiconductor apparatus according to claim 1, wherein
a thickness of the circuit pattern is equal to or greater than 1.5 times with respect to a thickness of the ceramic substrate, and
a thickness of the metal layer is equal to or greater than 1.5 times with respect to the thickness of the ceramic substrate.

8. The semiconductor apparatus according to claim 1, wherein
the circuit pattern, the metal layer and the base plate are made of same material.

9. A method for manufacturing a semiconductor apparatus comprising:
fixing an outer edge portion of a base plate to a case, the base plate having warpage in a downward convex shape;
placing an insulating circuit board on the base plate via a first joint material, the insulating circuit board including a ceramic substrate, a circuit pattern formed on an upper surface of the ceramic substrate, and a metal layer formed on a lower surface of the ceramic substrate;
placing a semiconductor device on the circuit pattern via a second joint material;
placing a lead frame on the semiconductor device via a third joint material;
melting the first joint material, the second joint material and the third joint material,
wherein force that is generated by the melting and warps the insulating circuit board in an upward convex shape is alleviated by warpage of the base plate so that warpage of the insulating circuit board is reduced, and
the ceramic substrate is thinner than each of the circuit pattern and the metal layer.

10. The method for manufacturing a semiconductor apparatus according to claim 9, wherein by warpage in the downward convex shape, a bottom surface of an outer edge of the base plate is higher than a bottom surface of a center of the base plate by less than 1.0 mm.

11. A semiconductor apparatus comprising:
a base plate;
an insulating circuit board including a ceramic substrate, a circuit pattern formed on an upper surface of the ceramic substrate, and a metal layer formed on a lower surface of the ceramic substrate and fixed on an upper surface of the base plate with a first joint material;
a semiconductor device having a first surface fixed on the circuit pattern with a second joint material and a second surface which is an opposite surface of the first surface;
a lead frame fixed on the second surface with a third joint material; and
a case fixed to an outer edge portion of the base plate and enclosing the semiconductor device,
wherein restoring force acts on the insulating circuit board in a direction of warpage that is convex upward,
restoring force acts on the base plate in a direction of warpage that is convex downward, and
the semiconductor device includes a plurality of devices, and one lead frame is fixed to the plurality of devices with the third joint material.

12. A semiconductor apparatus comprising:
a base plate;
an insulating circuit board including a ceramic substrate, a circuit pattern formed on an upper surface of the ceramic substrate, and a metal layer formed on a lower surface of the ceramic substrate and fixed on an upper surface of the base plate with a first joint material;
a semiconductor device having a first surface fixed on the circuit pattern with a second joint material and a second surface which is an opposite surface of the first surface;
a lead frame fixed on the second surface with a third joint material; and
a case fixed to an outer edge portion of the base plate and enclosing the semiconductor device, wherein restoring force acts on the insulating circuit board in a direction of warpage that is convex upward, restoring force acts on the base plate in a direction of warpage that is convex downward, and the circuit pattern is thicker than the metal layer.

13. A semiconductor apparatus comprising:

a base plate;

an insulating circuit board including a ceramic substrate, a circuit pattern formed on an upper surface of the ceramic substrate, and a metal layer formed on a lower surface of the ceramic substrate and fixed on an upper surface of the base plate with a first joint material;

a semiconductor device having a first surface fixed on the circuit pattern with a second joint material and a second surface which is an opposite surface of the first surface;

a lead frame fixed on the second surface with a third joint material;

a case fixed to an outer edge portion of the base plate and enclosing the semiconductor device; and a terminal fixed to the case and fixed to the lead frame with a fourth joint material in a region enclosed by the case, wherein restoring force acts on the insulating circuit board in a direction of warpage that is convex upward, and restoring force acts on the base plate in a direction of warpage that is convex downward.

14. A semiconductor apparatus comprising:

a base plate;

an insulating circuit board including a ceramic substrate, a circuit pattern formed on an upper surface of the ceramic substrate, and a metal layer formed on a lower surface of the ceramic substrate and fixed on an upper surface of the base plate with a first joint material;

a semiconductor device having a first surface fixed on the circuit pattern with a second joint material and a second surface which is an opposite surface of the first surface;

a lead frame fixed on the second surface with a third joint material; and a case fixed to an outer edge portion of the base plate and enclosing the semiconductor device, wherein restoring force acts on the insulating circuit board in a direction of warpage that is convex upward, restoring force acts on the base plate in a direction of warpage that is convex downward, a thickness of the circuit pattern is equal to or greater than 1.5 times with respect to a thickness of the ceramic substrate, and a thickness of the metal layer is equal to or greater than 1.5 times with respect to the thickness of the ceramic substrate.

15. A semiconductor apparatus comprising:

a base plate;

an insulating circuit board including a ceramic substrate, a circuit pattern formed on an upper surface of the ceramic substrate, and a metal layer formed on a lower surface of the ceramic substrate and fixed on an upper surface of the base plate with a first joint material;

a semiconductor device having a first surface fixed on the circuit pattern with a second joint material and a second surface which is an opposite surface of the first surface;

a lead frame fixed on the second surface with a third joint material; and a case fixed to an outer edge portion of the base plate and enclosing the semiconductor device, wherein restoring force acts on the insulating circuit board in a direction of warpage that is convex upward, restoring force acts on the base plate in a direction of warpage that is convex downward, and the circuit pattern, the metal layer and the base plate are made of same material.

* * * * *